United States Patent
Ajit

[19]

[11] Patent Number: 5,877,515
[45] Date of Patent: Mar. 2, 1999

[54] SIC SEMICONDUCTOR DEVICE

[75] Inventor: Janardhanan S. Ajit, Sunnyvale, Calif.

[73] Assignee: International Rectifier Corporation, El Segundo, Calif.

[21] Appl. No.: 720,465

[22] Filed: Sep. 30, 1996

Related U.S. Application Data

[60] Provisional application No. 60/004,983 Oct. 10, 1995.

[51] Int. Cl. [6] .................................................. H01L 29/76
[52] U.S. Cl. .............................. 257/76; 257/77; 257/154
[58] Field of Search ................................ 257/76, 77, 154, 257/183, 401, 192, 196, 328

[56] References Cited

U.S. PATENT DOCUMENTS

| | | | |
|---|---|---|---|
| 4,920,396 | 4/1990 | Shinohara et al. | 257/190 |
| 5,216,264 | 6/1993 | Fujii et al. | 257/77 |
| 5,272,096 | 12/1993 | de Fresart et al. | 437/31 |
| 5,323,040 | 6/1994 | Baliga | 257/77 |
| 5,336,904 | 8/1994 | Kusunoki | 257/347 |
| 5,378,912 | 1/1995 | Pein | 257/77 |
| 5,378,923 | 1/1995 | Mitsui et al. | 257/616 |
| 5,396,085 | 3/1995 | Baliga | 257/77 |
| 5,408,106 | 4/1995 | Seabaugh | 252/17 |
| 5,510,275 | 4/1996 | Malhi | 437/41 |
| 5,539,217 | 7/1996 | Edmond et al. | 257/77 |

FOREIGN PATENT DOCUMENTS

| | | | |
|---|---|---|---|
| 2159592 | 6/1973 | France | 257/77 |
| 60-136223 | 7/1985 | Japan | 257/77 |
| 94/13017 | 6/1994 | WIPO | 257/77 |

OTHER PUBLICATIONS

Shenoy P et al: "Vertical Schottky Barrier Diodes on 3C–SiC Grown on Si", International Electron Devices Meeting 1994.Technical Digest (Cat. No. 94CH35706). Proceedings of 1994 IEEE International Electron Devices Meeting, San Francisco, CA, USA, 11–14 Dec. 1994, ISBN 0–7803–2111–1, 1994, New York, NY, USA, IEEE, USA, pp. 411–414 XPOOO585521.

*Primary Examiner*—Donald L. Monin, Jr.
*Attorney, Agent, or Firm*—Ostrolenk, Faber, Gerb & Soffen, LLP

[57] ABSTRACT

A semiconductor device structure having an epitaxial layer, formed of silicon for example, is disposed on a high bandgap material, such as silicon carbide, which is in turn disposed on a semiconductor substrate, such as silicon. The high band gap material achieves a charge concentration much higher than that of a conventional semiconductor material for the same breakdown voltage.

46 Claims, 3 Drawing Sheets

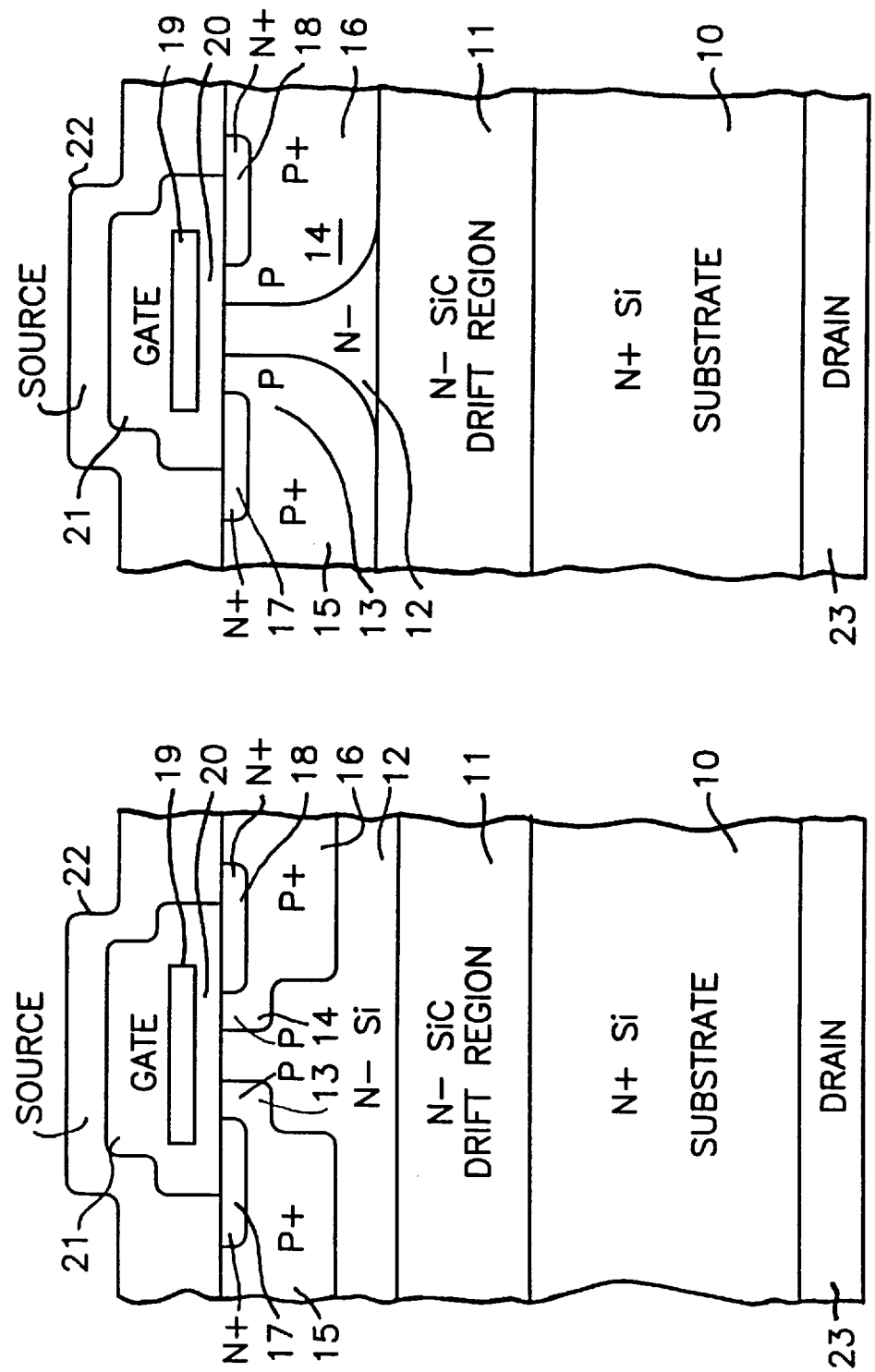

SIC SEMICONDUCTOR DEVICE

BACKGROUND OF THE INVENTION

RELATED APPLICATIONS

This application claims the benefit of U.S. Provisional application Ser. No. 60/004,983 filed on Oct. 10, 1995.

FIELD OF THE INVENTION

This invention relates to semiconductor devices. Specifically, this invention relates to high voltage semiconductor devices. More specifically, this invention relates to semiconductor devices requiring high conductivity and high breakdown voltages.

DESCRIPTION OF THE RELATED ART

Silicon carbide (SiC) has a higher band gap than silicon (Si) and, hence, SiC has a higher critical avalanche electric field than Si with a potential of 100 times higher performance compared to silicon for high voltage devices. Specifically, 3C-SiC has about a 4 times higher critical avalanche electric field than Si; 6H-SiC has about an 8 times higher critical avalanche electric field than Si; and 4H-SiC has about a 10 times higher critical avalanche electric field than Si. The high critical electric field of SiC allows for higher doping and thinner drift regions thereby reducing the on-resistance of SiC power devices as compared to conventional Si power devices.

However, a problem currently exists with SiC devices, namely, that it is difficult to diffuse dopants into the SiC material. Specifically, the diffusion of dopants into SiC requires temperatures in the range of 1800° C. Another problem with the use of SiC is that the material exhibits low MOS channel carrier mobility and, therefore, when SiC is used as a channel material in a semiconductor device, the conductivity of the channel may be degraded.

SUMMARY OF THE INVENTION

The present invention overcomes the deficiencies in the prior art detailed above by providing a semiconductor structure which includes a thin epitaxial layer of Si on a body of SiC material. It is preferred that the thin epitaxial layer be about 3 μm thick. The structure of the present invention may be used in a power MOSFET, a trench power MOSFET, a diode, and other semiconductor devices.

To reduce cost, the SiC layer can be formed on a highly doped Si substrate (3C-SiC has been reported in literature to be easily grown on Si). These structures, for example a power MOSFET having an epitaxially grown silicon layer, may be produced in an existing silicon power MOSFET fabrication facility using existing processes.

The drift regions of devices employing the structure of the present invention (such as power MOSFETs) consist mainly of SiC and, since the doping of SiC can be much higher than that of Si (while supporting the same voltage as a conventional Si device), the new device structures of the present invention provide lower on-resistances as compared to conventional Si power devices. It should be noted, however, that the breakdown voltages of device structures of the present invention are still determined by the critical field at the P body/N⁻ drift region junction formed at least partly in Si. For high-voltage devices (e.g., greater than 60 volts) the device structures of the present invention are expected to provide 20%–90% lower on-resistances as compared to conventional Si devices.

In the new structures of the present invention, the P body/N⁻ drift region junction can be formed either completely in Si or at the Si/SiC hetero-junction. For greatest improvement, it is preferred that the Si layer be thinner and the P body diffusions be made such that the P body/N⁻ drift region junctions are formed in SiC. However, such structures require the diffusion of dopants into SiC at high temperatures and for long time periods as compared to the diffusion of dopants in Si.

It is noted that structures employing other high band-gap semiconductor materials can be used in place of the specified SiC material and still be embraced by the present invention.

BRIEF DESCRIPTION OF THE DRAWINGS

Other features and advantages of the present invention will become apparent from the following description of the invention which refers to the accompanying drawings wherein:

FIG. 1 shows a cross-section of a power DMOSFET device employing a structure of the present invention;

FIG. 4 shows a cross-section of an alternate embodiment of a power DMOSFET device employing a structure of the present invention;

DETAILED DESCRIPTION OF THE PREFERRED EMBODIMENTS

Figure 3:
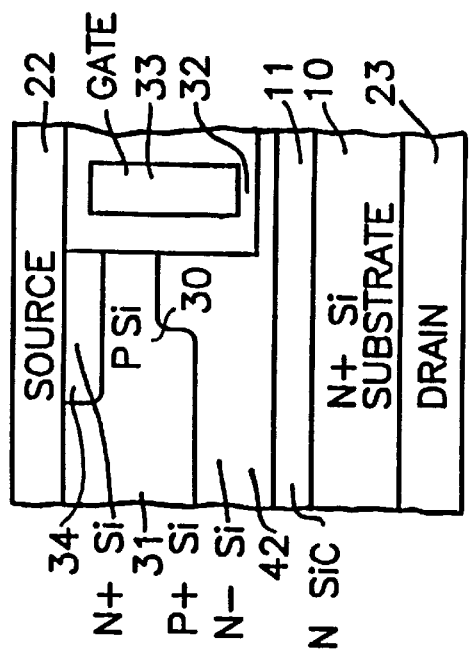
FIG. 3 shows a cross-section of a trench power MOSFET device employing a structure of the present invention.

In the attached drawings, FIG. 1 shows a new SiC power DMOSFET structure in accordance with the present invention in which an N type SiC drift region 11 is disposed on an N⁺ Si substrate 10 of the conventional type. SiC region 11 is more highly doped than Si and, thus, SiC region 11 is less resistive than prior art Si drift regions while still maintaining a high breakdown voltage. A three micron thick N⁻ epitaxial layer 12 is grown on top of the SiC drift region 11. Conventional power MOSFET junctions (such as P⁻ channel regions 13, 14; P⁺ body regions 15, 16; N⁺ sources 17, 18; polysilicon gate 19; gate oxide 20; inter-layer oxide 21; and overlying source contact 22) are disposed on the N⁻ epitaxial layer 12. A drain contact 23 is disposed on the bottom of substrate 10.

Figure 6:
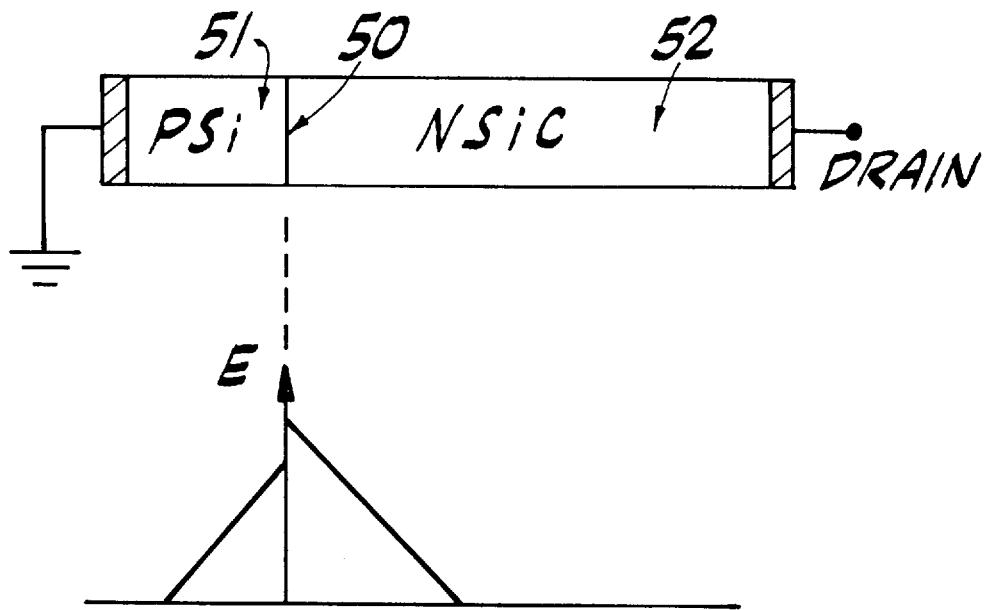
FIG. 6 shows a cross-section of a junction of P-type silicon and N-type silicon carbide and a corresponding E field distribution across the junction in accordance with the device of FIG. 4 of the present invention.
Figure 7:
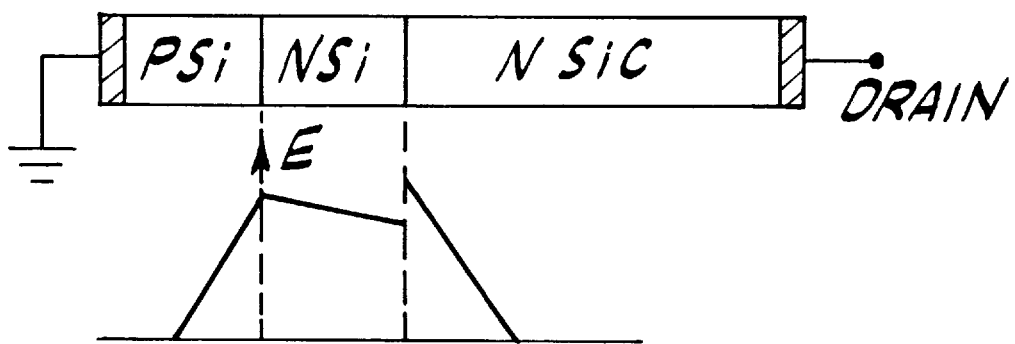
FIG. 7 shows a cross-section of higher voltage supporting junction of the device structure of FIG. 1 and corresponding E field distribution.

With reference to FIG. 6, it will be shown that the amount of charge in the SiC region 11 is more than 3 times that of silicon for the same breakdown voltage. FIG. 6 shows a junction 50 of P type Si 51 and N type SiC 52 where the corresponding E-field is also provided. To get a lower on-resistance for the drift region compared to Si MOSFET, the drift region damping ($N_D$) for supporting the high voltage should be high and the drift region thickness (W) for supporting the high voltage should be small. In other words, the drift region should be capable of supporting the blocking voltage with high doping (ND) and minimum thickness (W).

At the junction 50, Gauss' Law provides that the following equations are valid:

$$\epsilon E_{Si} = \epsilon_{SiC} * E_{SiC}$$

$$E_{Si} = (\epsilon_{SiC}/\epsilon_{Si}) * E_{SiC}$$

$$E_{Si} \approx 0.82 * E_{SiC}, \text{ for 3C-SiC}$$

$$E_{SiC} \approx 1.21 * E_{Si}, \text{ for 3C-Sic}$$

In general, for uniform doping in the drift region, the following relationships are valid:
$E_c = qN_D W_c/\epsilon$, where $E_c$ is the critical avalanche breakdown field for this structure at breakdown
$E_{SiC} = 1.21 * E_{c,Si}$ $$\text{slope of } E \text{ field} = \frac{dE}{dY} = \frac{qN_D}{\epsilon}$$

drift region doping, $N_D$, is proportional to $E_{drift,max}$ drift region thickness, $W$, is proportional $\epsilon$.

The above equation indicates that for the E field to go down to zero in the shortest distance (for minimum drift region thickness W), the dielectric constant of drift region material ($\epsilon$) should be as low as possible.

Thus, for higher drift region doping, the drift region should be made of material with higher critical avalanche field compared to silicon.

For smaller drift region thickness, the drift region should be made of material with lower dielectric constant compared to silicon.

SiC has a higher critical avalanche field and a lower dielectric constant compared to Si. Thus, SiC is well suited as a drift region material and for lowering the resistance of the drift region, the drift region should be made substantially of a material like SiC.

With reference to FIG. 1, any desired topology can be employed in providing junctions in the N⁻ epitaxial layer 12, thereby obtaining other MOS gated devices in accordance with the present invention.

Figure 2:
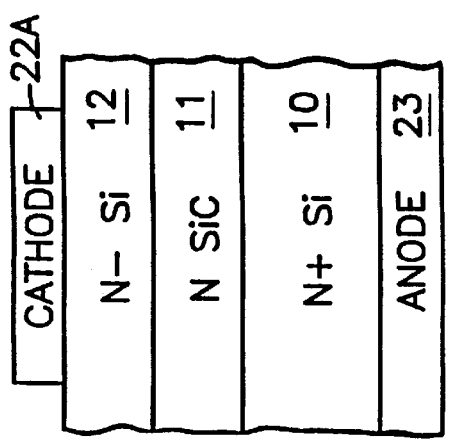
FIG. 2 shows a cross-section of a Schottky barrier diode device employing a structure of the present invention.

FIG. 2 shows a Schottky barrier diode employing a structure in accordance with the present invention. Elements similar to those of FIG. 1 have the same identifying numerals. The major differences between the structures of FIG. 1 and FIG. 2 are that (i) the region 12 has no junction (rather, a conventional guard ring can be used); and (ii) the cathode 22a is preferably a high work function material, such as molybdenum or the like. As discussed above, the amount of charge in the SiC material is much higher than that of Si for the same breakdown voltage and, therefore, the conductivity of the device is improved over conventional devices having the same breakdown voltage.

FIG. 3 shows a trench power MOSFET employing a structure in accordance with the present invention. Specifically, a P silicon layer 30 extending from a P⁺ body 31 is disposed against a gate oxide 32 which lines the trench etched in the silicon. The trench is filled with a poly-silicon gate 33. An N⁺ source diffusion region 34 is diffused into P regions 30, 31 and a source contact 22 is disposed on regions 31 and 34 and gate oxide 32. As discussed above, the amount of charge in the SiC material is much higher than that of Si for the same breakdown voltage.

The device of FIG. 4 is an alternate embodiment of a MOSFET in accordance with the present invention and is similar to that of FIG. 1. In the device of FIG. 4, the P⁺ bases 15 and 16 directly contact the SiC drift region 11, leaving a comparatively narrower epitaxial layer 12.

Figure 5:
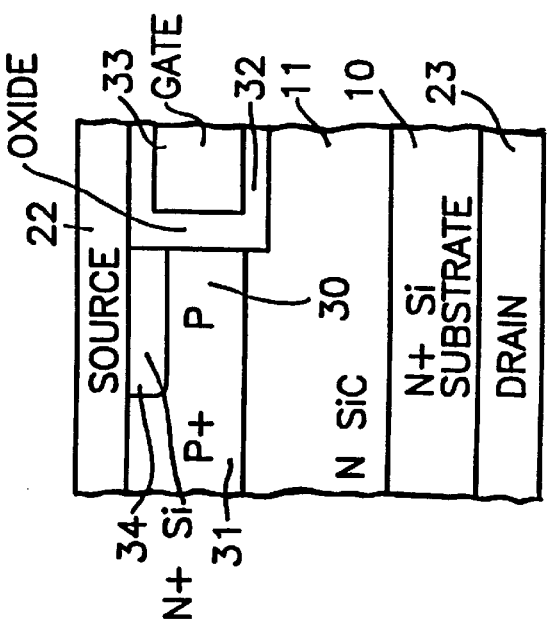
FIG. 5 shows a cross-section of an alternate embodiment of a trench power MOSFET device employing a structure of the present invention.

The device of FIG. 5 is similar to that of FIG. 3, except that the junction between the P⁺ region 31, the P region 30 and the N type region 11 is formed at the Si/SiC heterojunction.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device comprising:
   a semiconductor substrate which forms part of the conduction path;
   a drift region comprised of a material having a band gap that is greater than that of said semiconductor substrate and being disposed on the semiconductor substrate;
   an epitaxial layer of semiconductor material having a smaller band gap than said drift region and being disposed on the high band-gap materials;
   at least one electrode disposed on a top surface of said epitaxial layer; and
   at least another electrode disposed on a bottom surface of said semiconductor substrate.

2. The semiconductor device of claim 1, wherein the higher band-gap material forming said drift region is a low dielectric constant, high carrier mobility material.

3. The semiconductor device of claim 1, wherein the epitaxial layer of semiconductor material is about three $\mu$m thick.

4. The semiconductor device of claim 1, wherein the semiconductor substrate material is silicon.

5. The semiconductor device of claim 1, wherein the higher band-gap material forming said drift region is silicon carbide.

6. The semiconductor device of claim 1, wherein the epitaxial layer of semiconductor material is silicon.

7. The semiconductor device of claim 1, wherein the semiconductor substrate material is silicon, the higher band-gap material forming said drift region is silicon carbide, and the epitaxial layer of semiconductor material is silicon.

8. A MOSFET semiconductor device comprising:
   a doped semiconductor substrate which forms part of the conduction path;
   a doped drift region comprised of a material having a band gap that is greater than that of said semiconductor substrate and being disposed on the doped semiconductor substrate;
   a doped epitaxial layer of semiconductor material having a smaller band gap than said drift region and being disposed on the high band-gap material;
   at least one electrode disposed on a top surface of said epitaxial layer; and
   at least another electrode disposed on a bottom surface of said semiconductor substrate.

9. The MOSFET semiconductor device of claim 8, wherein the material forming said drift region is a low dielectric constant, high carrier mobility material.

10. The MOSFET semiconductor device of claim 8, wherein the epitaxial layer of semiconductor material is about, three $\mu$m thick.

11. The MOSFET semiconductor device of claim 8, wherein the semiconductor substrate material is silicon.

12. The MOSFET semiconductor device of claim 8, wherein the material forming said drift region is silicon carbide.

13. The MOSFET semiconductor device of claim 8, wherein the epitaxial layer of semiconductor material is silicon.

14. The MOSFET semiconductor device of claim 8, wherein the semiconductor substrate material is silicon, the material forming said drift region is silicon carbide, and the epitaxial layer of semiconductor material is silicon.

15. The semiconductor device of claim 8, wherein a high voltage supporting P body/N⁻ drift junction is formed at the epitaxial layer/higher band-gap material hetero-junction.

16. The semiconductor device of claim 8, wherein a high voltage supporting P body/N⁻ drift junction is formed in said epitaxial layer.

17. The semiconductor device of claim 8, wherein a high voltage supporting P body/N⁻ drift junction is formed in said higher band-gap material.

18. The MOSFET semiconductor device of claim 8 wherein said doped semiconductor substrate and said doped drift region are of one conductivity type, and said device further comprises: a trench formed in at least said doped epitaxial layer; a thin insulating layer formed on the walls and bottom surface of said trench; a region of polysilicon formed in said trench such that said trench is filled, thereby forming a gate electrode; a body region of another conductivity type, which is of opposite conductivity type to said one conductivity type, formed in said top surface of said epitaxial layer at least adjoining said trench; a source region of said one conductivity type formed in the top surface of said epitaxial layer in at least a portion of said body region adjoining said trench and forming a channel region in said body region between said source region and said epitaxial layer; a source electrode formed on said top surface of said epitaxial layer; and a drain electrode formed on said bottom surface of said doped semiconductor substrate.

19. The MOSFET semiconductor device of claim 18 wherein said trench is further formed in said higher band-gap material, and a high voltage supporting body/drift junction is formed at the epitaxial layer/higher band-gap material hetero-junction.

20. The MOSFET semiconductor device of claim 18 wherein said trench is further formed in said higher band-gap material, and a high voltage supporting body/drift junction is formed in said higher band-gap material.

21. The MOSFET semiconductor device of claim 18 wherein said doped epitaxial layer is of said one conductivity type, and a high voltage supporting body/drift junction is formed in said epitaxial layer.

22. The MOSFET semiconductor device of claim 8 wherein said doped semiconductor substrate, said doped drift region and said doped epitaxial layer are of one conductivity type, and said device further comprises: at least one body region of another conductivity type, which is of opposite conductivity type to said one conductivity type, formed in said top surface of said epitaxial layer; at least one source region of said one conductivity type formed in a portion of said body region at said top surface and forming a channel region in said top surface between said source region and said epitaxial layer; a gate electrode disposed atop said top surface and overlaying and being insulated from said channel region and being operable to invert said channel region in response to a suitable gate voltage supplied thereto; an overlaying insulation layer formed atop said gate electrode; a source electrode disposed at least atop said source region; and a drain electrode disposed on said bottom surface of said semiconductor substrate.

23. The semiconductor device of claim 22, wherein a high voltage supporting P body/N⁻ drift junction is formed at the epitaxial layer/higher band-gap material hetero-junction.

24. The semiconductor device of claim 22, wherein a high voltage supporting P body/N⁻ drift junction is formed in said epitaxial layer.

25. The semiconductor device of claim 22, wherein a high voltage supporting P body/N⁻ drift junction is formed in said higher band-gap material.

26. A semiconductor diode comprising:
a doped semiconductor substrate which-forms part of the conduction path;
a doped drift region comprised of a material having a band gap that is greater than that of said semiconductor substrate and being disposed on the doped semiconductor substrate;
a doped epitaxial layer of semiconductor material having a smaller band gap than said drift region and being disposed on the high band-gap material;
at least one electrode disposed on a top surface of said epitaxial layer; and
at least another electrode disposed on a bottom surface of said semiconductor substrate.

27. The semiconductor diode of claim 26, wherein the material forming said drift region is a low dielectric constant, high carrier mobility material.

28. The semiconductor diode of claim 26, wherein the epitaxial layer of semiconductor material is about three μm thick.

29. The semiconductor diode of claim 26, wherein the semiconductor substrate material is silicon.

30. The semiconductor diode of claim 26, wherein the material forming said drift region is silicon carbide.

31. The semiconductor diode of claim 26, wherein the epitaxial layer of semiconductor material is silicon.

32. The semiconductor diode of claim 26, wherein the semiconductor substrate material is silicon, and the material forming said drift region is silicon carbide.

33. A semiconductor device comprising: a semiconductor substrate; a high band-gap material forming a drift region disposed on the semiconductor substrate; an epitaxial layer of semiconductor material disposed on the high band-gap material; said doped semiconductor substrate and said doped drift region being of one conductivity type; a trench formed in at least said doped epitaxial layer; a thin insulating layer formed on the walls and bottom surface of said trench; a region of polysilicon formed in said trench such that said trench is filled, thereby forming a gate electrode; a body region of another conductivity type, which is of opposite conductivity type to said one conductivity type, formed in a top surface of said epitaxial layer at least adjoining said trench; a source region of said one conductivity type formed in the top surface of said epitaxial layer in at least a portion of said body region adjoining said trench and forming a channel region in said body region between said source region and said epitaxial layer; a source electrode formed on said top surface of said epitaxial layer; and a drain electrode formed on a bottom surface of said doped semiconductor substrate.

34. The MOSFET semiconductor device of claim 33 wherein said trench is further formed in said higher band-gap material, and a high voltage supporting body/drift junction is formed at the epitaxial layer/high band-gap material hetero-junction.

35. The MOSFET semiconductor device of claim 33 wherein said trench is further formed in said higher band-gap material, and a high voltage supporting body/drift junction is formed in said high band-gap material.

36. The MOSFET semiconductor device of claim 33 wherein said doped epitaxial layer is of said one conductivity type, and a high voltage supporting body/drift junction is formed in said epitaxial layer.

37. The MOSFET semiconductor device of claim 33, wherein the semiconductor substrate material is silicon.

38. The MOSFET semiconductor device of claim 33, wherein the high band-gap material forming a drift region is silicon carbide.

39. The MOSFET semiconductor device of claim 33, wherein the epitaxial layer of semiconductor material is silicon.

40. A semiconductor device comprising: a semiconductor substrate; a high band-gap material forming a drift region disposed on the semiconductor substrate; an epitaxial layer of semiconductor material disposed on the high band-gap material; said doped semiconductor substrate, said doped drift region and said doped epitaxial layer are of one conductivity type; at least one body region of another conductivity type, which is of opposite conductivity type to said one conductivity type, formed in a top surface of said epitaxial layer; at least one source region of said one conductivity type formed in a portion of said body region at said top surface and forming a channel region in said top surface between said source region and said epitaxial layer; a gate electrode disposed atop said top surface and overlaying and being insulated from said channel region and being operable to invert said channel region in response to a suitable gate voltage supplied thereto; an overlaying insulation layer formed atop said gate electrode; a source electrode disposed at least atop said source region; and a drain electrode disposed on a bottom surface of said semiconductor substrate.

41. The semiconductor device of claim 40, wherein a high voltage supporting P body/N$^-$ drift junction is formed at the epitaxial layer/higher band-gap material hetero-junction.

42. The semiconductor device of claim 40, wherein a high voltage supporting P body/N$^-$ drift junction is formed in said epitaxial layer.

43. The semiconductor device of claim 40, wherein a high voltage supporting P body/N$^-$ drift junction is formed in said higher band-gap material.

44. The MOSFET semiconductor device of claim 40, wherein the semiconductor substrate material is silicon.

45. The MOSFET semiconductor device of claim 40, wherein the high band-gap material forming a drift region is silicon carbide.

46. The MOSFET semiconductor device of claim 40, wherein the epitaxial layer of semiconductor material is silicon.

* * * * *